US006237715B1

(12) United States Patent
Tracy

(10) Patent No.: US 6,237,715 B1
(45) Date of Patent: May 29, 2001

(54) SUBWOOFER ASSEMBLY

(76) Inventor: Dennis A. Tracy, 4304 Elenda St., Culver City, CA (US) 90230-4127

( * ) Notice: Subject to any disclaimer, the term of this patent is extended or adjusted under 35 U.S.C. 154(b) by 0 days.

(21) Appl. No.: 09/452,154

(22) Filed: Dec. 1, 1999

Related U.S. Application Data

(60) Provisional application No. 60/110,503, filed on Dec. 1, 1998.

(51) Int. Cl.[7] .......... H05K 5/00

(52) U.S. Cl. .......... 181/156; 181/141

(58) Field of Search .......... 181/141, 150, 181/156; 381/86, 334, 302

(56) References Cited

U.S. PATENT DOCUMENTS

| | | | |
|---|---|---|---|
| 4,392,027 * | 7/1983 | Bock | 181/150 |
| 4,572,326 * | 2/1986 | Hutchins | 181/156 |
| 5,394,478 * | 2/1995 | Hathaway et al. | 181/160 |
| 5,874,695 * | 2/1999 | Tracy | 181/156 |
| 6,076,631 * | 6/2000 | Hoenninger et al. | 181/141 |

* cited by examiner

*Primary Examiner*—Khanh Dang
(74) *Attorney, Agent, or Firm*—Welsh & Flaxman LLC

(57) ABSTRACT

A subwoofer assembly shaped and dimensioned for positioning within a wall of an aircraft fuselage. The subwoofer assembly includes a subwoofer housing having a curved profile shaped to substantially conform to the wall of an aircraft fuselage. The subwoofer housing includes a sound port through which sound is delivered from the subwoofer assembly. The subwoofer assembly further includes a sound driver mounted withing the subwoofer housing.

15 Claims, 5 Drawing Sheets

SUBWOOFER ASSEMBLY

CROSS-REFERENCE TO RELATED APPLICATIONS

This U.S. Patent Application is based upon U.S. Provisional Patent Application Ser. No. 60/110,503, filed Dec.1, 1998, entitled "SUBWOOFER ASSEMBLY".

BACKGROUND OF THE INVENTION

1. Field of the Invention

The invention relates to a subwoofer assembly. More particularly, the present invention relates to a curved subwoofer assembly shaped and dimensioned for mounting within the wall of an aircraft fuselage.

2. Description of the Prior Art

The current global community has made it possible for people from around the country, and around the world, to interact for both business and personal reasons. For many people, this requires that they spend considerable time traveling from one location to another location. More often than not, these people travel in aircraft.

Whether these people travel in private or commercial aircraft, they desire high quality entertainment during the many hours they spend within the confines of an aircraft. However, while high quality entertainment, for example, digital video with CD quality sound, is readily available for theater and home use, the weight and size requirements for use in aircraft make it very difficult to incorporate high fidelity systems within an aircraft. This problem is especially pronounced for audio speaker assemblies when one attempts to meet the size, weight and shape requirements for use in aircraft.

In the aircraft industry great priority is placed upon component weight and size reduction. In addition, spacing and positioning of the speaker assemblies is a great priority to those optimizing the operation of aircraft. The size, weight and shape of conventional terrestrial speaker assembly designs adversely affect range and payload. These concerns are notable when one attempts to make changes within smaller private jets. For example, a small increase in the weight carried by an aircraft results in a substantial increase in the fuel consumption of the aircraft. In addition, the limited space available within an aircraft dictates the use of any space within the aircraft be carefully considered by those responsible for ensuring the comfort of passengers.

Lightweight and compact audio speakers are currently available. These speakers, however, substantially compromise sound quality for reductions in size and weight. An individual wishing to add an audio system to an aircraft must make a choice between high fidelity speakers not suiting the size and weight requirements of the aircraft and lower quality speakers providing desirable size and weight characteristics.

A need, therefore, exists for a speaker assembly providing high fidelity sound, while also meeting the size and weight requirements of an aircraft. The present invention provides such a speaker assembly.

SUMMARY OF THE INVENTION

It is, therefore, an object of the present invention to provide a subwoofer assembly shaped and dimensioned for positioning within a wall of an aircraft fuselage. The subwoofer assembly includes a subwoofer housing having a curved profile shaped to substantially conform to the wall of an aircraft fuselage. The subwoofer housing includes a sound port through which sound is delivered from the subwoofer assembly. The subwoofer assembly further includes a sound driver mounted withing the subwoofer housing.

It is also an object of the present invention to provide a subwoofer assembly including a sound baffle directing sound generated by the driver to the sound port.

It is another object of the present invention to provide a subwoofer assembly wherein the sound baffle defines a sound space within the subwoofer housing that expands as the sound baffle extends toward the sound port.

It is a further object of the present invention to provide a subwoofer assembly wherein the sound baffle includes a first baffle section which creates a sound space that expands as the sectional baffle toward the sound port.

It is also another object of the present invention to provide a subwoofer assembly wherein the sectional baffle includes a second baffle section which couples the first baffle section to a third baffle section.

It is still a further object of the present invention to provide a subwoofer assembly wherein the third baffle section creates a sound space that expands as the third baffle section extends toward the sound port.

It is yet another object of the present invention to provide a subwoofer assembly wherein the subwoofer housing is made from aluminum.

It is also an object of the present invention to provide a subwoofer assembly wherein the subwoofer housing includes a front curved wall and a rear curved wall connected by a plurality of side walls.

It is a further object of the present invention to provide an aircraft having a fuselage including side walls, wherein at least one subwoofer assembly shaped and dimensioned for positioning within the wall of an aircraft fuselage is mounted within the side walls of the fuselage.

It is another object of the present invention to provide an aircraft wherein the aircraft includes windows positioned along the side walls of the fuselage and the subwoofer assembly is mounted within the side walls of the fuselage between windows positioned along the side walls of the fuselage.

It is also an object of the present invention to provide an aircraft including a sound conduit coupled to the sound port of the subwoofer assembly for directing sound generated by the subwoofer assembly into the passenger compartment of the aircraft.

It is still another object of the present invention to provide a method for positioning a subwoofer assembly within an aircraft. The method is achieved by mounting a subwoofer assembly within a side wall of an aircraft fuselage such that the subwoofer is hidden from the view of a passenger compartment of the aircraft and directing sound from the subwoofer to the passenger compartment of the aircraft.

Other objects and advantages of the present invention will become apparent from the following detailed description when viewed in conjunction with the accompanying drawings, which set forth certain embodiments of the invention.

DESCRIPTION OF THE PREFERRED EMBODIMENT

The detailed embodiment of the present invention is disclosed herein. It should be understood, however, that the disclosed embodiment is merely exemplary of the invention, which may be embodied in various forms. Therefore, the details disclosed herein are not to be interpreted as limited, but merely as the basis for the claims and as a basis for teaching one skilled in the art how to make and/or use the invention.

Figure 1:
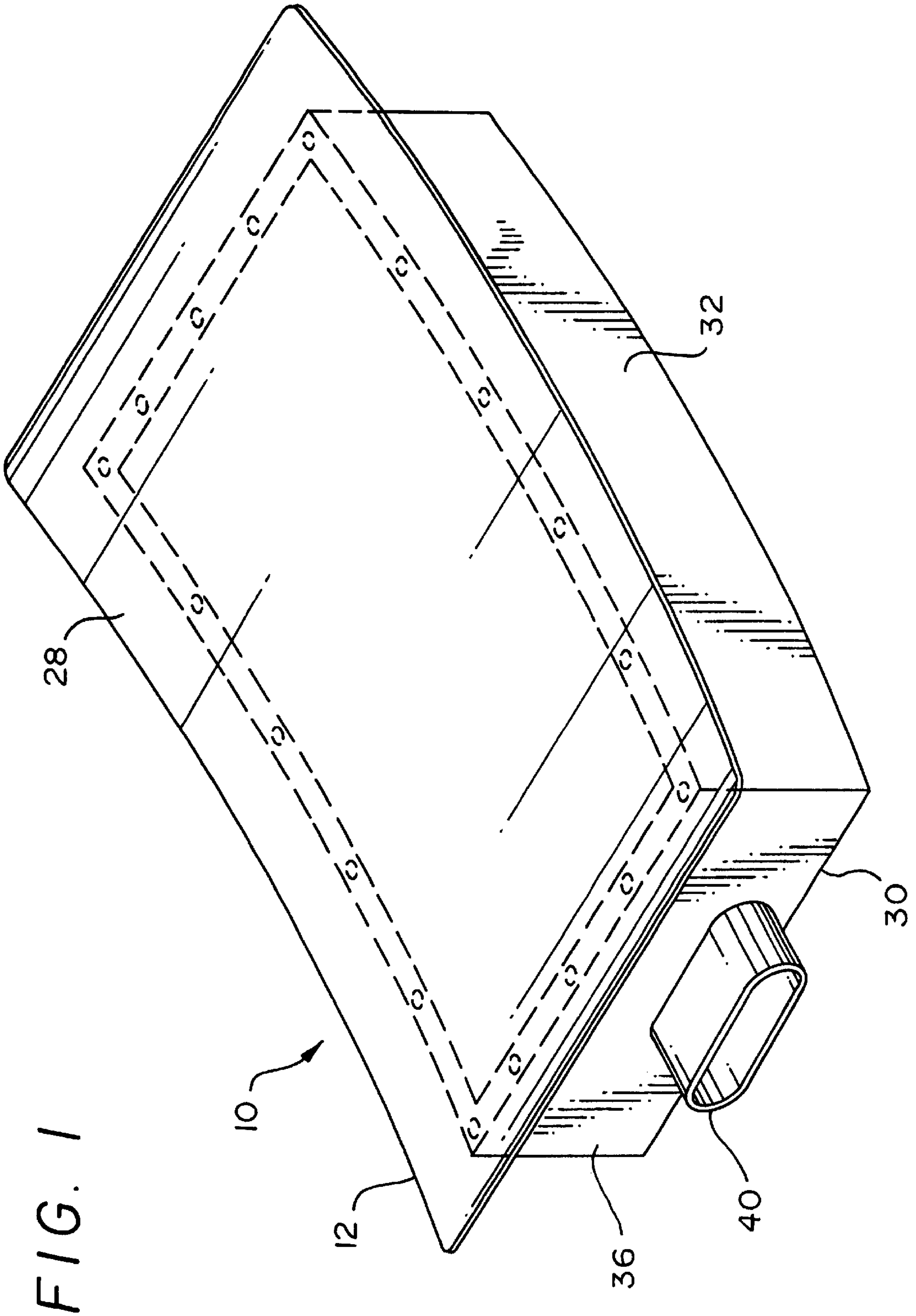
FIG. 1 is a perspective view of the present subwoofer.
Figure 2:
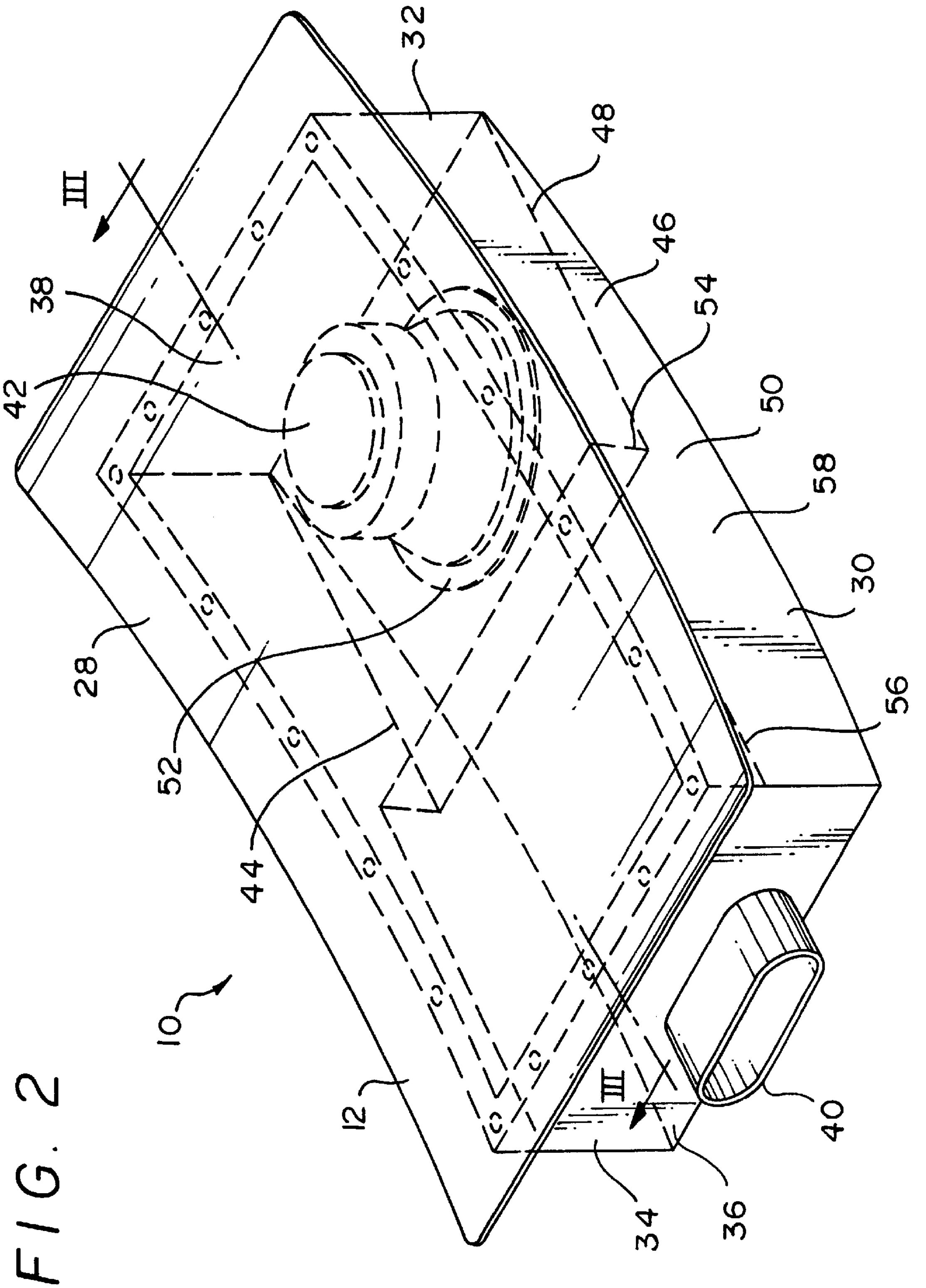
FIG. 2 is a perspective view of the present subwoofer with the internal components shown in phantom.
Figure 3:
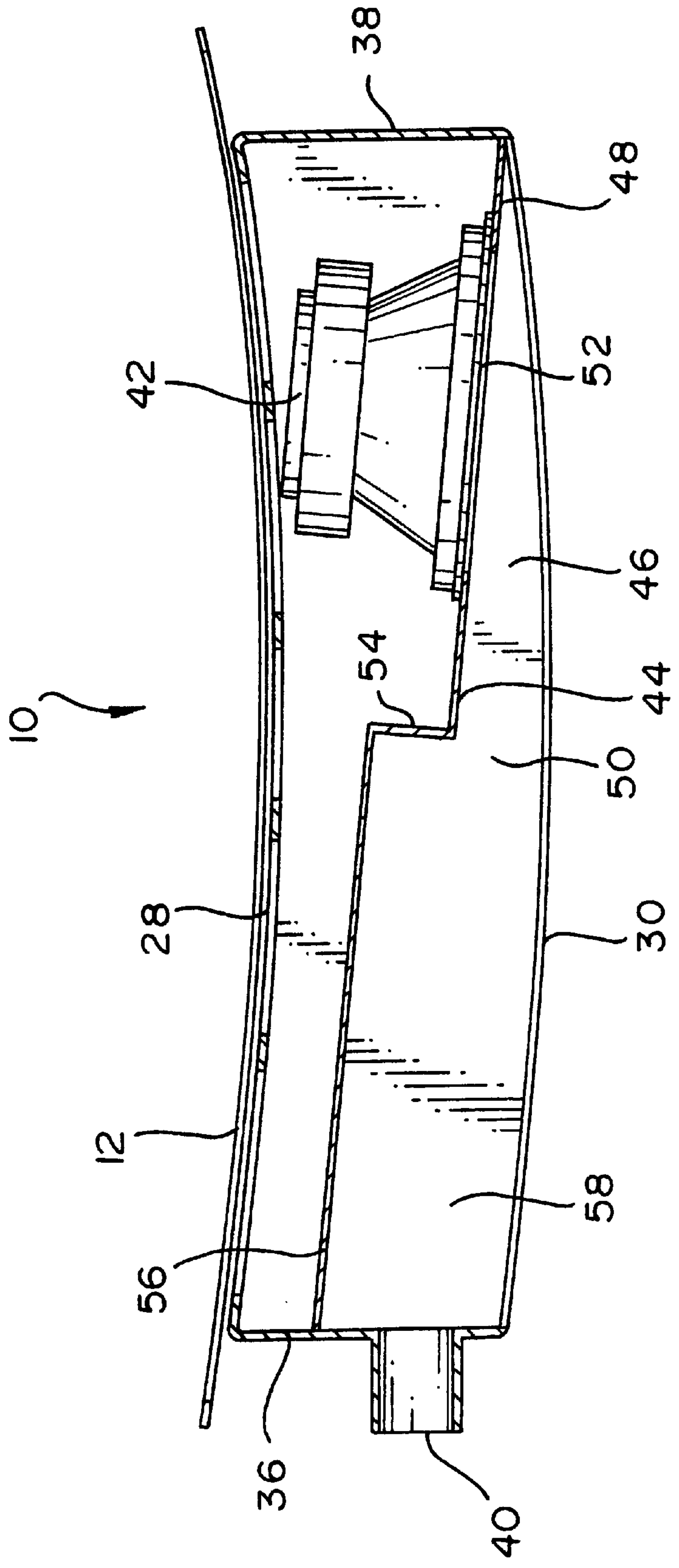
FIG. 3 is a cross sectional view of the present subwoofer along the line III—III in FIG. 2.

With reference to FIGS. 1 through 3, a curved subwoofer assembly 10 in accordance with the present invention is disclosed. The subwoofer assembly 10 includes a subwoofer housing 12 shaped and dimensioned to fit within the wall 14 of an aircraft fuselage 16 (see FIGS. 4 and 5). Specifically, the subwoofer housing 10 is shaped and dimensioned to fit within the side wall 14 of the fuselage 16, that is, between the outer shell 18 of the aircraft and the internal wall 20 seen from the passenger compartment 22 of the aircraft 24. The subwoofer housing 12 is also shaped to fit between adjacent side windows 26 of the aircraft 24. The subwoofer housing 12 is preferably made of lightweight materials, for example, the housing is preferably made from aluminum, although other materials may be employed without departing from the spirit of the present invention.

As such, the subwoofer housing 12 is concavely curved to conform to the side wall 14 of the fuselage 16 between adjacent windows 26 of the aircraft 24. The curvature of the subwoofer housing 12 substantially matches the curvature of the aircraft fuselage 16 along the side wall 14 where one intends to position the subwoofer assembly 10.

The subwoofer housing 12 includes a front wall 28 and a rear wall 30 connected by first and second lateral side walls 32, 34, a top side wall 36 and a bottom side wall 38. The front and rear walls 32, 34 are similarly curved to create the resulting curved subwoofer housing 12. Since the front and rear walls 28, 30 are curved, the first and second lateral side walls 32, 34 are similarly curved along their front and rear edges to conform with the curvature of the front and rear walls 28, 30.

Sound generated by the subwoofer assembly 10 is directed from the subwoofer housing 12 through a sound port 40 formed in the top side wall 38 of the subwoofer housing 12. The sound port 40 of the present subwoofer housing 12 is substantially oval shaped, although other shapes may be employed without departing from the spirit of the present invention.

The internal structure of the subwoofer assembly 12 is composed of a low frequency driver 42 mounted on a sound baffle 44 extending from the bottom side wall 38 to the top side wall 36 within the subwoofer housing 12. The sound generated by the subwoofer assembly 10 is enhanced by the provision of an angled sound baffle 44 within the subwoofer housing 12. Specifically, the sound baffle 44 is angled as it extends from the bottom side wall 38 of the subwoofer housing 12 to the top side wall 36 of the subwoofer housing 12 to create a sound space 46 which expands as the sound baffle 44 extends from the bottom side wall 38 of the subwoofer housing 12 to the top side wall 36 of the subwoofer housing 12. The sound baffle 44 controls transmission of sound from the driver 42 to the sound port 40 in a manner optimizing the generated sound.

Specifically, the sound baffle 44 includes a first baffle section 48 extending from the bottom side wall 38 of the subwoofer housing 12 to a central section 50 of the subwoofer housing 12. The driver 42 is mounted within an opening 52 formed in the first baffle section 48 of the sound baffle 44. The driver 42 preferably works in a standard subwoofer frequency range, although drivers functioning in different ranges may be used without departing from the spirit of the invention. The driver 42 includes standard sound source connections and may include crossover circuitry if so desired for the final sound system configuration.

The sound space 46 created by the first baffle section 48, that is, the space between the first baffle section 48 and the rear wall 30 of the subwoofer housing 12 increases as the first baffle section 48 extends from the bottom side wall 38 of the subwoofer housing 12 toward the central section 50 of the subwoofer housing 12. A second baffle section 54 couples the first baffle section 48 to a third baffle section 56, which extends from the central section 50 to the top side wall 38 of the subwoofer housing 12.

The second baffle section 54 extends away from the rear wall 30 of the subwoofer housing 12 and increases the spacing between the rear wall 30 of the subwoofer housing 12 and the third baffle sectional 56. As with the first baffle section 48, the sound space 58 created by the third baffle section 56 and the rear wall 30 of subwoofer housing 12 increases as the third baffle section 56 extends from the central section 50 of the subwoofer housing 12 toward the top side wall 36 of the subwoofer housing 12.

Figure 4:
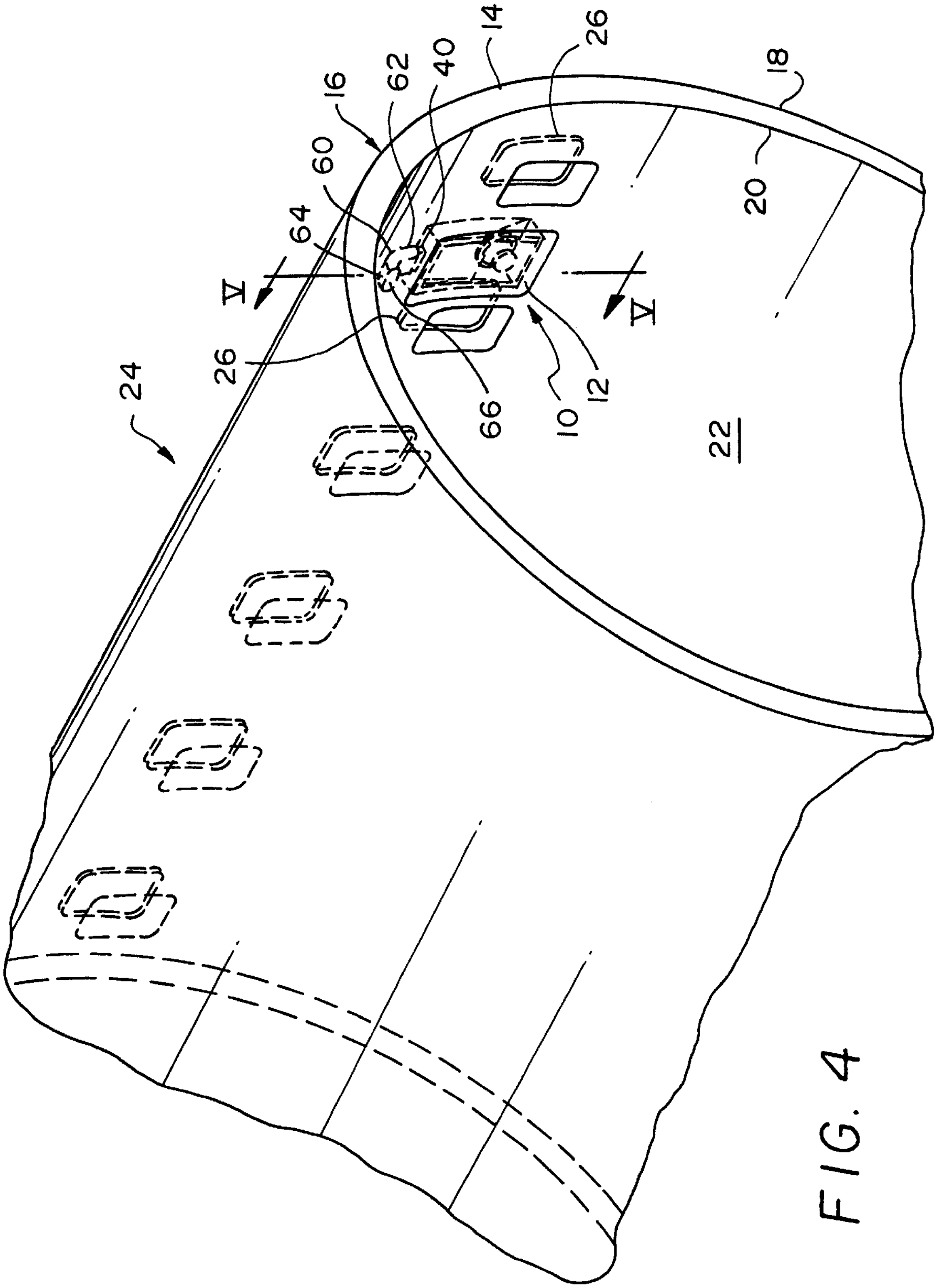
FIG. 4 is a perspective view showing the present subwoofer installed within the fuselage of an aircraft.
Figure 5:
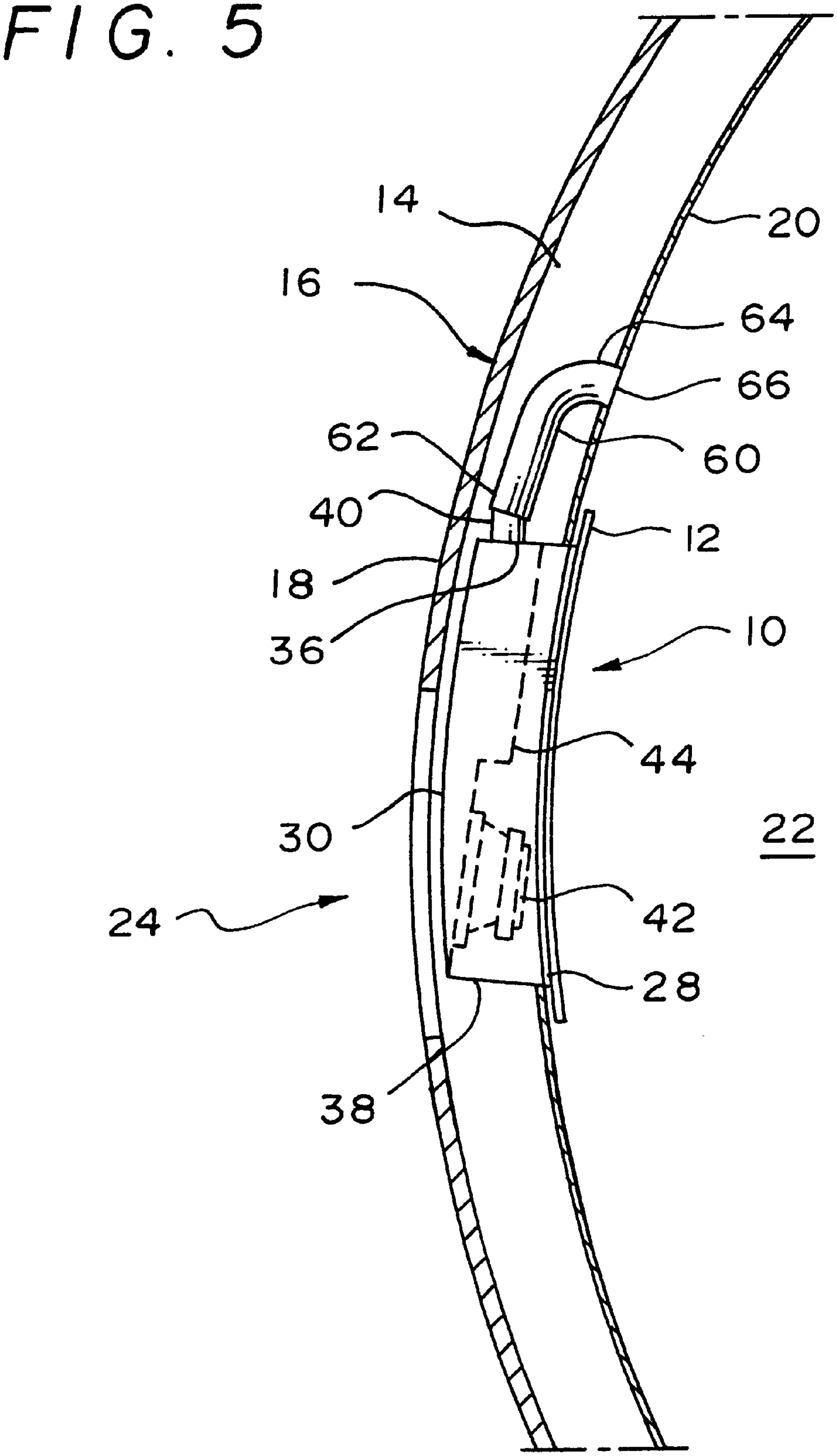
FIG. 5 is a cross sectional view of the present subwoofer along the line V—V in FIG. 4.

As shown in FIGS. 4 and 5, and as briefly discussed above, the subwoofer assembly 10 is mounted within the side wall 14 of the aircraft fuselage 16 between adjacent side windows 26. Specifically, the subwoofer assembly 10 is mounted between the outer shell 18 of the fuselage 16 and the internal wall 20 of the passenger compartment 22. In this way, the subwoofer assembly 10 does not occupy any of the space found within the passenger compartment 22 of the aircraft 24. The efficiency of this positioning allows the subwoofer assembly 10 to be incorporated within an aircraft 24 without compromising the interior design of the passenger compartment 22.

The subwoofer assembly 10 is mounted such that the sound port 40 in the top side wall 36 extends upwardly within the side wall 14 of the aircraft fuselage 16. However, the sound port 40 may be oriented in other directions without departing from the spirit of the present invention. A sound tube 60 couples the sound port 40 to the passenger compartment 22 of the aircraft 24. Specifically, the proximal end 62 of the sound tube 60 is coupled to the sound port 40 of the subwoofer assembly 10 and the distal end 64 of the sound tube 40 is directed to the passenger compartment 22 of the aircraft 24.

The distal end 64 of the sound tube 60 is mounted flush with a conforming hole 66 formed in the internal wall 20 of the passenger compartment 22 to direct sound therein. The distal end 64 of the sound tube 60 may be covered to conform with the interior decor of the aircraft 24 and hide the port through which the sound enters the passenger compartment 22 of the aircraft 24.

By porting the sound generated by the subwoofer assembly 10 in the manner discussed above, the sound may enter the passenger compartment at any convenient location. The interior decor panels between the windows, therefore, need not be altered to suit the positioning of the subwoofer assembly. As such, the interior panels remain intact, maintaining the noise insulation and structural stability provided by the interior panels.

In practice, multiple subwoofers are commonly mounted within an aircraft. The number of subwoofers employed is determined by the size of the aircraft and the needs of the aircraft owners. Those of ordinary skill in the art will certainly appreciate the need for specific positioning of the subwoofers within the aircraft to optimize the generated sound.

It is further contemplated that the exact shape of the subwoofer assembly may be varied to suit specific needs. For example, the unit could be wider than tall where the fuselage construction dictates such a design.

While the preferred embodiment has been shown and described, it will be understood that there is no intent to limit the invention by such disclosure, but rather, it is intended to cover all modifications and alternate constructions falling within the spirit and scope of the invention as defined in the appended claims.

What is claimed is:

1. A subwoofer assembly shaped and dimensioned for positioning within a wall of an aircraft fuselage, the subwoofer assembly comprising:

a subwoofer housing including a curved profile shaped to substantially conform to the wall of an aircraft fuselage, the subwoofer housing including a sound port through which sound is delivered from the subwoofer assembly; and a sound driver mounted withing the subwoofer housing.

2. The subwoofer assembly according to claim 1, further including a sound baffle directing sound generated by the driver to the sound port.

3. The subwoofer assembly according to claim 2, wherein the sound baffle defines a sound space within the subwoofer housing that expands as the sound baffle extends toward the sound port.

4. The subwoofer assembly according to claim 2, wherein the sound baffle includes a first baffle section which creates a sound space that expands as the sectional baffle toward the sound port.

5. The subwoofer assembly according to claim 4, wherein the sectional baffle includes a second baffle section which couples the first baffle section to a third baffle section.

6. The subwoofer assembly according to claim 5, wherein the third baffle section creates a sound space that expands as the third baffle section extends toward the sound port.

7. The subwoofer assembly according to claim 1, wherein the subwoofer housing is made from aluminum.

8. The subwoofer assembly according to claim 1, wherein the subwoofer housing includes a front curved wall and a rear curved wall connected by a plurality of side walls.

9. An aircraft, comprising:

a fuselage including side walls;

at least one subwoofer assembly mounted within the side walls of the fuselage, the subwoofer assembly being shaped and dimensioned for positioning within the wall of an aircraft fuselage, wherein the subwoofer assembly includes;

a subwoofer housing including a profile shaped to substantially conform to the wall of an aircraft fuselage, the subwoofer housing including a sound port through which sound is delivered from the subwoofer assembly to a passenger compartment of the aircraft; and a sound driver mounted withing the subwoofer housing for generating predetermined sounds.

10. An aircraft according to claim 9, wherein the subwoofer housing is curved to substantially conform to the side walls of the aircraft fuselage.

11. An aircraft according to claim 9, wherein the aircraft includes windows positioned along the side walls of the fuselage and the subwoofer assembly is mounted within the side walls of the fuselage between windows positioned along the side walls of the fuselage.

12. An aircraft according to claim 9, wherein the subwoofer housing is made from aluminum.

13. An aircraft according to claim 9, further including a sound conduit coupled to the sound port of the subwoofer assembly for directing sound generated by the subwoofer assembly into the passenger compartment of the aircraft.

14. A method for positioning a subwoofer assembly within an aircraft, comprising the following steps:

mounting a subwoofer assembly within a side wall of an aircraft fuselage such that the subwoofer is hidden from the view of a passenger compartment of the aircraft;

directing sound from the subwoofer to the passenger compartment of the aircraft; and wherein the subwoofer assembly has a curved profile which substantially conforms to the curvature of the aircraft fuselage.

15. A method for positioning a subwoofer assembly within an aircraft, comprising the following steps:

mounting a subwoofer assembly within a side wall of an aircraft fuselage such that the subwoofer is hidden from the view of a passenger compartment of the aircraft; and directing sound from the subwoofer to the passenger compartment of the aircraft;

wherein the aircraft includes windows positioned along the side walls of the aircraft fuselage and the subwoofer is mounted between adjacent windows.

* * * * *